United States Patent [19]

Potter et al.

[11] Patent Number: 4,899,439
[45] Date of Patent: Feb. 13, 1990

[54] METHOD OF FABRICATING A HIGH DENSITY ELECTRICAL INTERCONNECT

[75] Inventors: Curtis N. Potter; Lawrence N. Smith; Harry Kroger, all of Austin, Tex.

[73] Assignee: Microelectronics and Computer Technology Corporation, Austin, Tex.

[21] Appl. No.: 367,418

[22] Filed: Jun. 15, 1989

[51] Int. Cl.$^4$ .............................................. H05K 3/02
[52] U.S. Cl. ........................................ 29/846; 29/830; 174/255; 361/414; 428/901
[58] Field of Search .................. 29/846, 830; 174/68.5; 361/414; 428/901

[56] References Cited

U.S. PATENT DOCUMENTS

| | | | |
|---|---|---|---|
| 3,405,227 | 10/1968 | Hazlett | 361/414 X |
| 3,526,541 | 9/1970 | Peltzer | 117/211 |
| 3,528,048 | 9/1970 | Kirk | 337/401 |
| 3,606,677 | 9/1971 | Ryan | . |
| 3,634,602 | 1/1972 | Vonn Bruck | 174/68.5 |
| 3,646,670 | 3/1972 | Maeda et al. | 29/830 |
| 4,026,011 | 5/1977 | Walton | . |
| 4,250,616 | 2/1981 | Klimek et al. | 29/830 |
| 4,268,956 | 5/1981 | Parks et al. | 29/869 |
| 4,438,560 | 3/1984 | Kisters | 29/830 |
| 4,438,561 | 3/1984 | Mueller | 29/831 |
| 4,480,288 | 10/1984 | Gazdik et al. | 361/398 |
| 4,598,166 | 7/1986 | Neese | 174/68.5 |
| 4,667,404 | 5/1987 | Reisman et al. | 174/68.5 X |
| 4,783,722 | 11/1988 | Osaki et al. | 174/68.5 X |
| 4,803,450 | 2/1989 | Burgess et al. | 29/830 X |
| 4,821,007 | 4/1989 | Fields et al. | 29/830 X |

Primary Examiner—Carl J. Arbes
Attorney, Agent, or Firm—Fulbright & Jaworski

[57] ABSTRACT

A high density electrical interconnect having a plurality of metallic conductors supported from metallic pillars which are electrically isolated from the ground plane by openings. The interconnect can be fabricated using a temporary support dielectric, which may be removed after completion to provide an air dielectric or be replaced with a more suitable permanent dielectric. The removal of the temporary support allows the conductors to be coated with protective layers or with a layer of a higher conductivity.

5 Claims, 5 Drawing Sheets

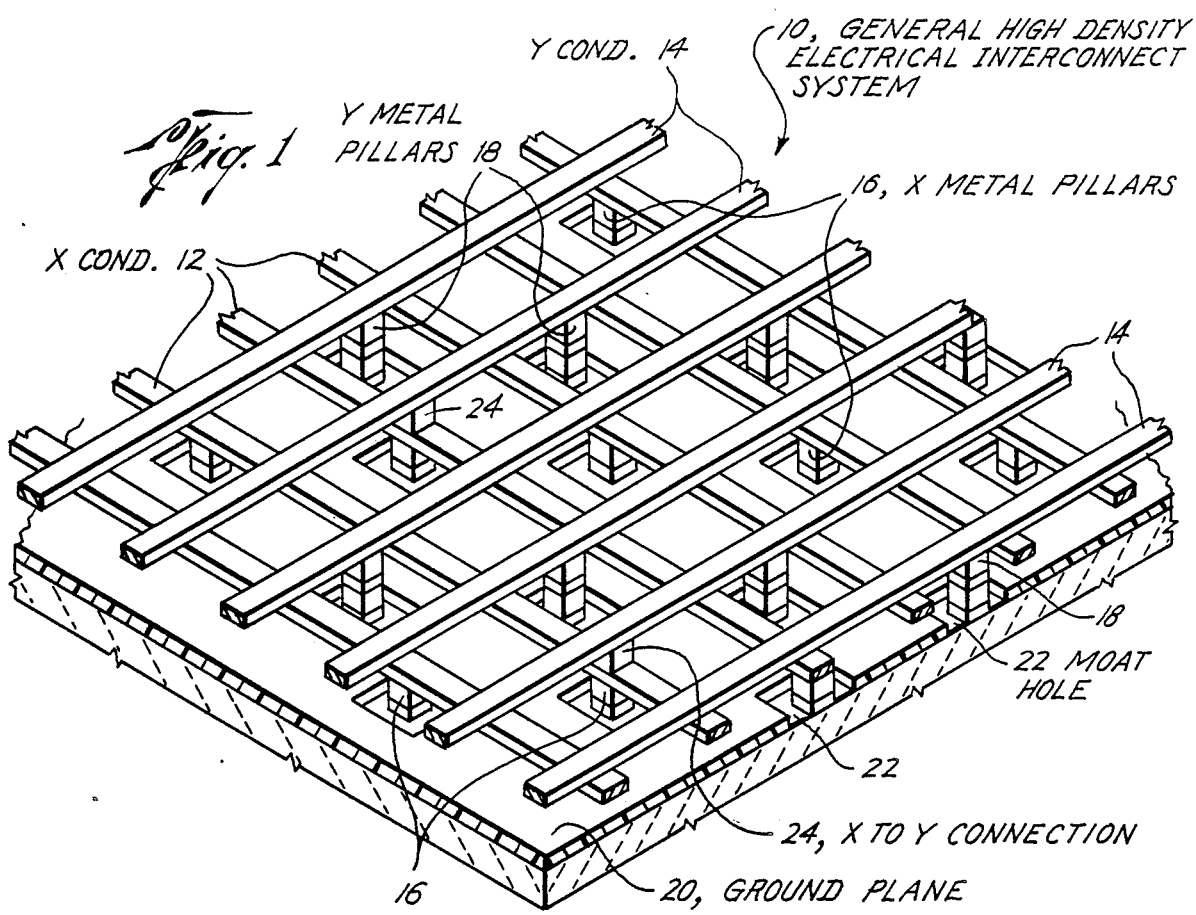
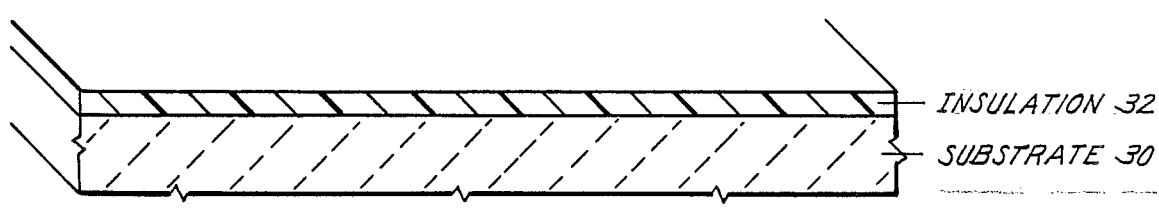
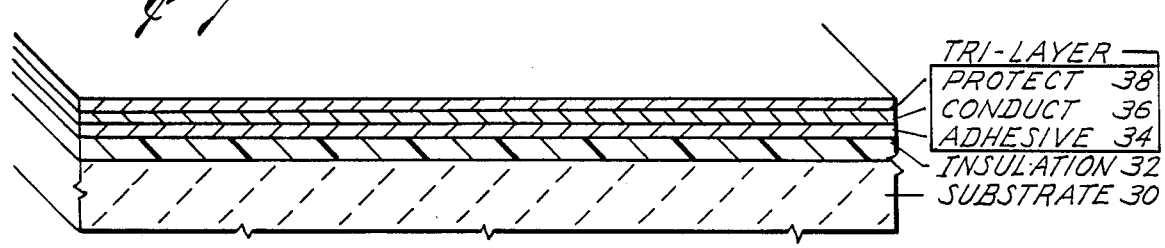

METHOD OF FABRICATING A HIGH DENSITY ELECTRICAL INTERCONNECT

BACKGROUND OF THE INVENTION

Because of the increasing operational speeds of semiconductor integrated circuits, conventional electrical interconnect systems for transmitting data between such higher speed integrated circuits has become inadequate. The maximum speed of electric signals along conductors is achieved by using air as the dielectric medium which has a dielectric constant of one. In addition, interconnect distance should be as short as possible which requires a high density of conductor lines per unit area. Another factor affecting the speed of signals along interconnect lines is the resistive losses in small cross-sectional area lines. Also, in order to preserve pulse shape and minimize signal distortion, it is desirable to use controlled impedance transmission lines as interconnects.

Therefore, it is important to provide an interconnect fabrication sequence to produce an interconnect system having the following features: (1) high density providing short interconnect paths, (2) lowest dielectric constant possible, (3) low resistance conductors, (4) controlled, matched impedance interconnects, (5) minimum impedance discontinuities, and (6) highest possible fabrication yield process.

The present invention discloses a method of fabricating a very high density electrical interconnect system which provides simplicity of fabrication for high yield along with flexibility of material selection to facilitate integration of the substrate into a variety of complete systems with varying performance criteria to maximize the above-described features.

SUMMARY

The present invention is directed to a method of fabricating a multi-level electrical interconnect system having increased pulse propagation speed and minimum pulse attenuation, superior band width due to its controlled impedance, and multiple levels of interconnect fabricated with associative ground planes.

A further object is the provision of a multi-level, high density interconnect system in which the fabrication method allows a final, high surface electrical conductivity metal overcoating of the conductors resulting in minimum pulse attenuation.

Still a further object of the present invention is the provision of a multi-level high density electrical interconnect system in which the fabrication sequence provides a low dielectric pillar support by removing temporary dielectric support used in the fabrication to provide an air bridge or provide a backfill of a permanent low dielectric material which could not be used in the fabrication process.

A still further object is wherein the fabrication sequence of the present invention allows a final non-corrosive protective layer to be applied to all exposed conductors in order to eliminate corrosion effects between the conductors and any dielectric material.

Yet a further object of the present invention is the provision of a method of fabricating a high density electric interconnect which includes covering a substrate with a layer of an insulating material, applying an adhesion layer to the insulating material, applying a conductive ground plane and a plurality of first layers of support pillars over the adhesion layer but leaving openings in the ground plane around the first layers for isolating the support pillars from the ground plane. The method further includes applying a second adhesive layer to the first layers in the ground plane, applying a second layer of insulating material and etching holes in the second layer of insulating material over the first layers of the support pillars. The method further includes plating a second layer onto each of the first layers of the support pillars. The method further includes repeating the steps of applying adhesion layers, insulating layers, and etching of the insulating layers to form openings for additional layers of support pillars and at least one metallic conductor, and plating up the support pillars and metallic conductors, and after completion, removing the layers of insulating material.

A further object includes applying a protective coating to the pillars and the conductors, and/or coating the metallic conductors with a metal having a higher conductivity than the metallic conductors, and/or placing a low dielectic material into the space created by removing the insulating material.

Other and further objects, features and advantages will be apparent from the following description of presently preferred embodiments of the invention, given for the purpose of disclosure, and taken in conjunction with the accompaying drawings.

BRIEF DESCRIPTION OF THE DRAWINGS

FIG. 1 is a perspective elevational view of one embodiment of the present invention, FIGS. 2–14 are perspective elevational views illustrating the sequence of fabrication of a portion of a multi-level electrical interconnect system of the present invention.

DESCRIPTION OF THE PREFERRED EMBODIMENTS

Figure 4:
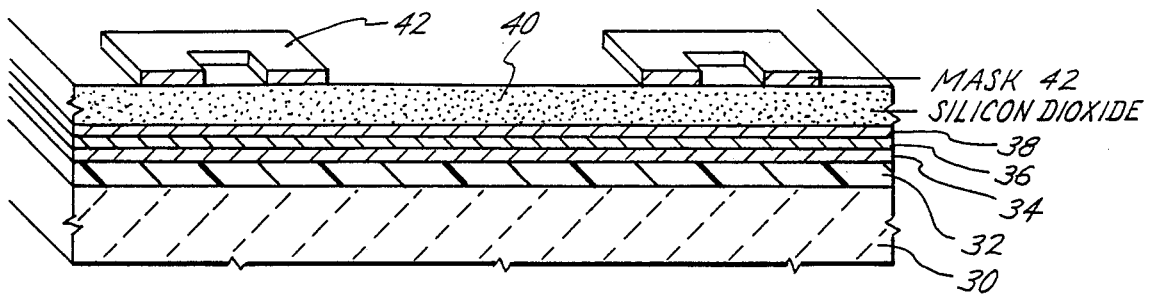

Referring now to the drawings, and particularly to FIG. 1, the reference numeral 10 generally indicates a portion of a high-density electrical interconnect system and generally includes a plurality of X conductors 12 shown running at right angles to a plurality of Y conductors 14. The metal X conductors 12 are supported from a plurality of metal pillars or support posts 16, and the Y conductors 14 are supported from a plurality of metal pillars or support posts 18.

The interconnect 10 is sequentially fabricated up layer by layer starting from the bottom, as will be more fully described hereinafter, from a ground plane 20 to the top, Y conductors 14 in this case. As the metallic layers are built up, a dielectric support layer (not shown) is built up at the same time, layer by layer, simultaneously with the pillar and conductor layers, to act as a temporary or permanent support for the metallic conductors 12 and 14. The total number of layers fabricated may be more than the number illustrated as the present process does not inherently limit the total number of conductor and pillar layers.

Preferably, the X conductors 12 are separated from the ground plane 20 by the height of the X pillars 16, and the Y conductors 14 are supported by their own higher height pillars 18 above the X conductors 12. Both the X pillars 16 and the Y pillars 18 are electrically isolated from the ground plane 20 by virtue of openings or a moat hole 22 in the ground plane 20 around each pillar 16 and 18. The metal ground plane 20 provides a controlled impedance for the X conductors 12. A Y conductor ground plane (not shown for convenience) may be added on top of the structure 10 shown by adding another set of pillars to the Y conductors 14 in order to separate the top ground plane from the Y conductors 14.

The width of the conductors 12 and 14 and their distance from the ground planes are chosen to provide the desired transmission line impedance as a function of the dielectric to be used. Connections between the X conductors 12 and the Y conductors 14 may be made anywhere an X conductor 12 crosses a Y conductor 14 by providing a metal conducting connection 24 therebetween.

The number of pillars per unit length of conductor is chosen as a function of the type of conductor and dielectric used. Fabrications have been using as few as one pillar for every 1000 microns of conductor length using conductors of 5 micron thicknesses and 10 micron widths with a solid dielectric therebetween. Using air as the dielectric, copper conductors with Cross-Sectional area of 50 square microns have been fabricated which are adequately supported with pillars every 500 microns. Typically, 10 micron wide conductors are supported with 10×10 micron square pillars which are 10 microns high, although these dimensions can be varied considerably to accommodate a wide range of characteristic impedance.

There are several significant advantages in the present fabrication method of making the interconnect 10. The structure can be fabricated using a temporary support dielectric which is chosen for ease of fabrication processsing, but which is removed at the end of the processing to provide an air dielectric or replaced with a more suitable permanent low dielectric constant material.

The present process of fabrication and its sequence allows for the conductors 12 and 14 to be supported in place during the dielectric removal or substitution process. Instances where this procedure may be desirable would include situations where the final dielectric may be porous or too flimsy to support the conductors 12 and 14 through the processing, but be suitable for use after the fabrication is completed. In particular, the use of a porous dielectric is desirable for the purpose of achieving a low dielectric constant but can cause problems during fabrication by absorbing chemicals during wet processing.

In the case of using air as the dielectric medium, it is necessary to use some sort Of temporary support during fabrication which is easily removable at the end of the process. For the very highest performance, air can be chosen as the dielectric medium since the conductors 12 and 14 are supported by the integral pillars 16 and 18, respectively.

The process of fabrication of the present invention will be described in which the preferred embodiment is to use chemical vapor deposited (CVD) silicon dioxide insulation for the temporary support with plated copper conductors. This allows for a simple fabrication process yet provides extremely high performance in the case of using air as the final dielectric. However, a wide variety of other materials may be used in place of the silicon dioxide dielectric such as silicon nitride, silicon monoxide, magnesium flouride, aluminum oxide, or other refractory materials which may be chosen for compatability with a particular metal conductor. In place of copper conductors, a variety of platable metal conductors may be used such as gold, palladium, nickel, silver, or other refractory materials. Also, the selection of a particular conductor to be used with a particular dielectric material may cause the sequences of conductor and dielectric application to a substrate to vary slightly.

Referring now to FIG. 2, the fabrication process of the present invention may best been seen. The starting substrate 30 may be of silicon, ceramic, or metal, with an adequate surface finish for the fabrication of microstructures. The thermal coefficient of expansion of the substrate 30 should closely match the thermal coefficient of expansion of the metal of the conductors 12 and 14 in order to minimize stress in the conductors 12 and 14, especially if an air bridge system is to be used. In the case of a conductive substrate 3, it is necessary to render the surface insulating through the application of a continuous blanket layer of insulation 32, such as silicon dioxide. This may be conveniently applied through conventional sputter vacuum deposition.

Referring now to FIG. 3, next an adhesion layer is applied to cover the insulation 32 and may include an adhesive layer 34, a conductor precursor layer 36, and a protective layer 38, which are applied sequentially by conventional means such as sputter deposition or E-beam evaporation. The tri-layer 34, 36 and 38 forms a plating interconnect. The adhesive layer 34 may be typically titanium, chromium, tantalum, or other material commonly used in the semiconductor art for adhesion promotion purposes and is typically 600 angstroms thick. A conduct layer 36 is typically copper and may be 2000 angstroms thick, but other platable materials will do as well within the constraints of adequate conductivity and platability. The protect layer 38 is typically titanium or chromium of about 500 angstroms thickness and serves both as an adhesive layer for the following silicon dioxide layer and a surface protective film for the copper layer 36.

Figure 5:
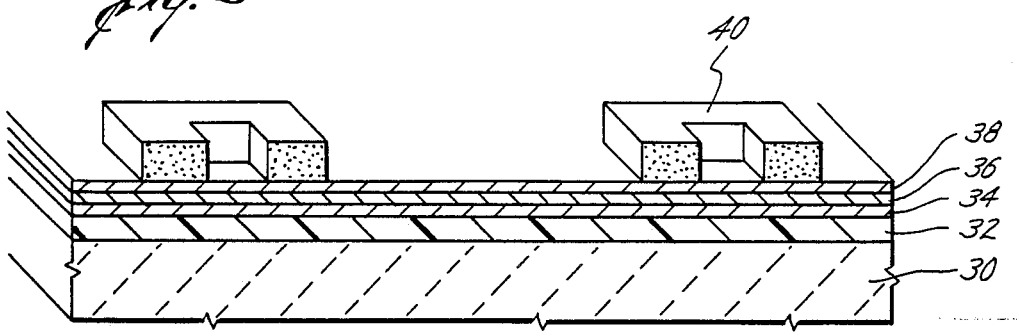

Referring now to FIG. 4, a layer 40 of CVD silicon dioxide is applied to the surface of the plating interconnect to a thickness equal to the desired thickness of the ground plane 20, typically 5 microns. The silicon dioxide layer 40 is then patterned by a standard photolithographic means such as Shipley 1375 photoresist mask 42. The silicon dioxide insulation layer 40 is etched anisotropically, such as by using a magnetron ion etch (MIE) reactive etch process with flourine gas chemistry. The mask 42, as best seen in FIG. 5, will mask the silicon dioxide layer 40 and prevent its etching where the ground plane openings 22 for pillar insulation will eventually exist.

Figure 6:
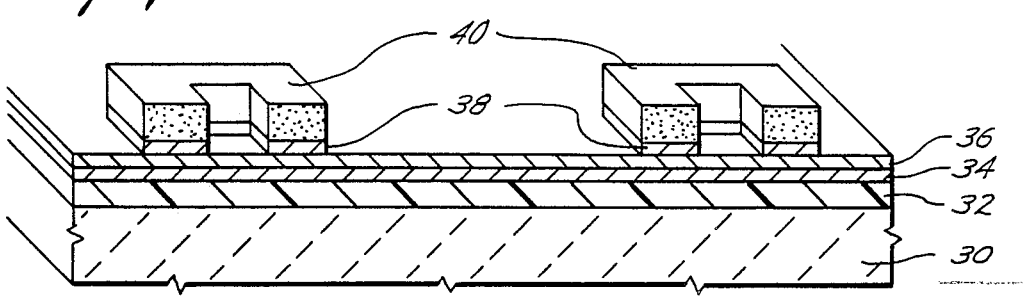

Referring now to FIG. 6, the protect layer 38 is removed, such as by wet etching in appropriate etchant, from the copper interconnect 36 at all places where it is not protected by the silicon dioxide mask 40.

Figure 7:
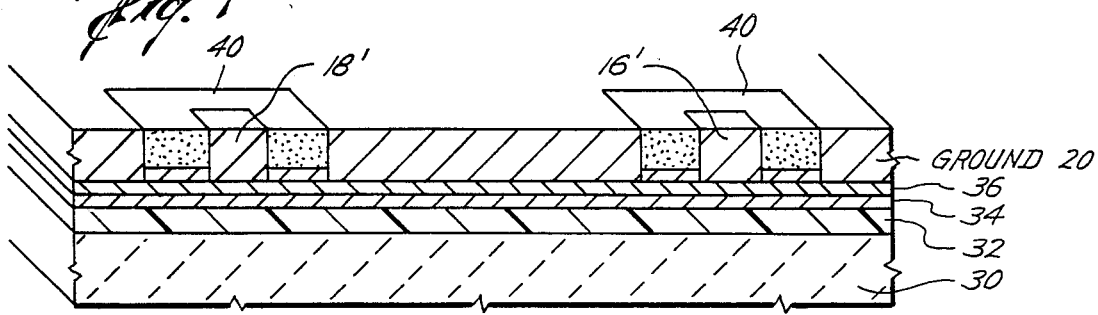

Referring now to FIG. 7, a metal, such as copper, is plated to a thickness equal to the thickness of the patterned silicon dioxide mask 40 to provide the ground plane 20 and the first layer 16' of an X conductor pillar 16 and a first layer 18 of a Y conductor pillar 18.

Figure 8:
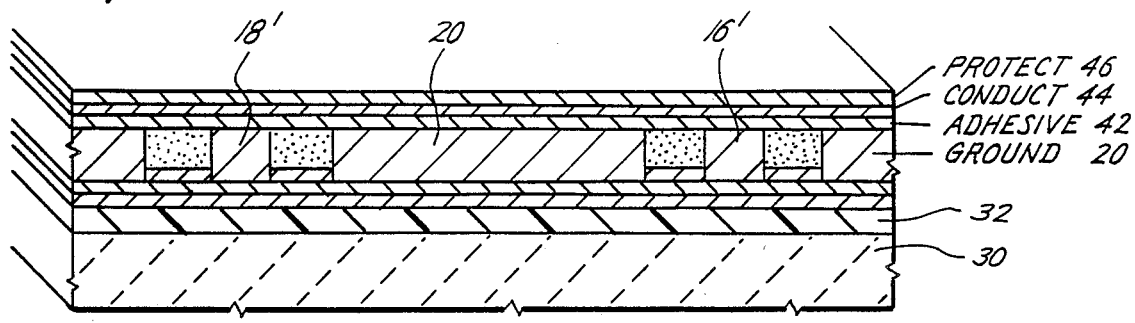

The process continues by repeating the previous basic steps. Referring now to FIG. 8, a second adhesion layer or plating interconnect is deposited which is identical to the first tri-layer 34, 36 and 38 (FIG. 3). That is, an adhesive layer 42, such as sputter deposited chrome, is followed by a conduct layer 44, such as copper, and a protect layer 46 covers the copper, such as titanium or chromium.

Figure 9:
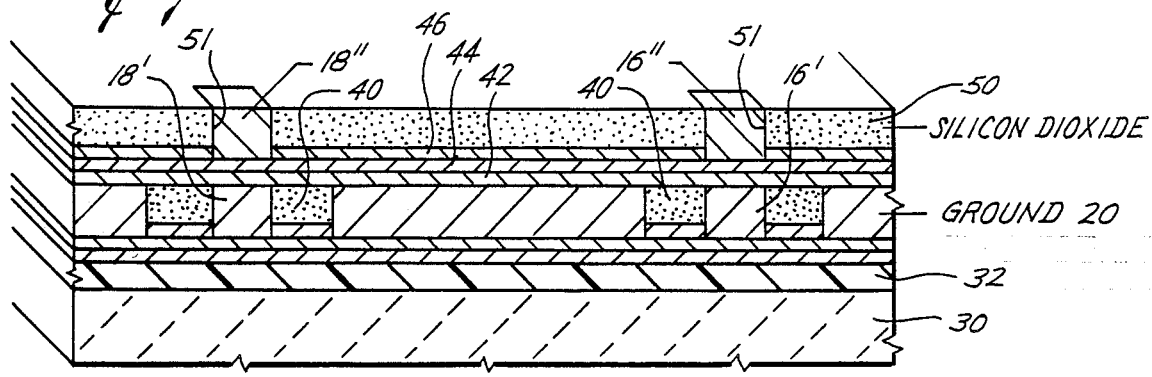

Referring now to FIG. 9, another insulating layer 50 of CVD silicon dioxide is deposited to provide the correct distance from the X conductor 12 to the ground plane 20. The layer 50 is patterned as described in connection with FIGS. 4 and 5, but in this step, via holes 51 have been etched in the layer 50 where the next layers of the metallic plated support pillars will need to be. Following the resist strip and protect layer 46 removal from the copper conduct 44 in the via holes 51, the second layers of the pillars are plated to a height equal to the thickness of the silicon dioxide layer 50. Thus, the second layers 18' of the Y conductor 18 and of the second layers 16 of the X conductor 16 are formed over the first layers 18 and 16', respectively.

Figure 10:
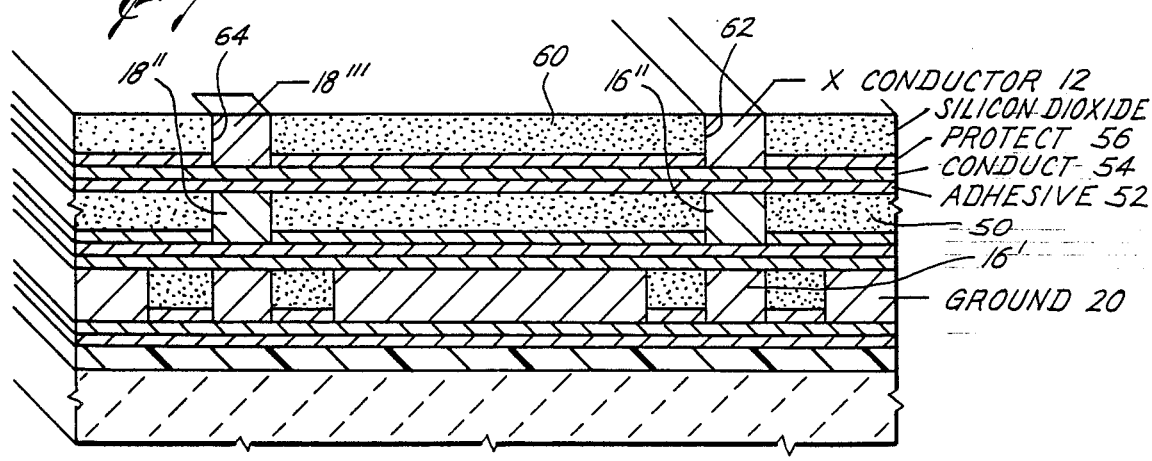

Referring now to FIG. 10, the basic sequence is again performed to form the X conductors 12 and an additional layer 18''' of the Y pillar 18. Thus, a third adhesion layer or plating interconnect is applied over the silicon dioxide insulation layer 50 and consists of adhesive layer 52, conduct layer 54, and protect layer 56, which may be identical to the first and second adhesion layers described previously. A third silicon dioxide insulation layer 60 is provided, which is provided with a resist, etched at 62 to provide an opening for the X conductor 12 and etched at 64 to provide another layer for a Y conductor pillar. Following the resist strip and the removal of the protect layer 56 beneath the openings 62 and 64, X conductors 12 are plated and the third layer 18''' of the Y pillars 18 are plated to a height equal to the silicon dioxide layer 60.

Figure 11:
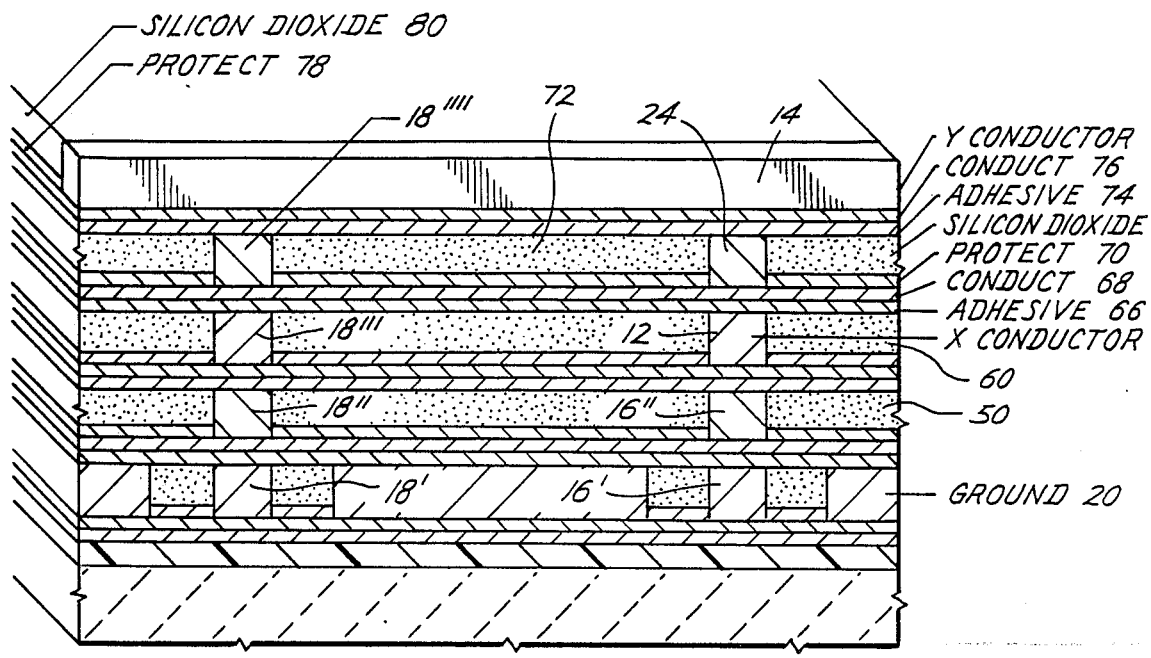

Referring now to FIG. 11, the process is repeated by adding a fourth adhesion layer consisting of adhesive layer 66, conduct layer 68, protect layer 70, which are then covered with another layer of silicon dioxide 72 which is etched to form a further layer 18'''' of the Y conductor pillar 18 and also connection 24 to provide a connection between an X conductor 12 ad a Y conductor 14. Thereafter, a still further adhesion layer consisting of adhesive layer 74, conduct layer 76, and protect layer 78 is applied and a still further layer of silicon dioxide 80. This allows the silicon dioxide 80 to again be etched to form Y conductors 14. These sequential steps are performed exactly as previously described.

Figure 12:
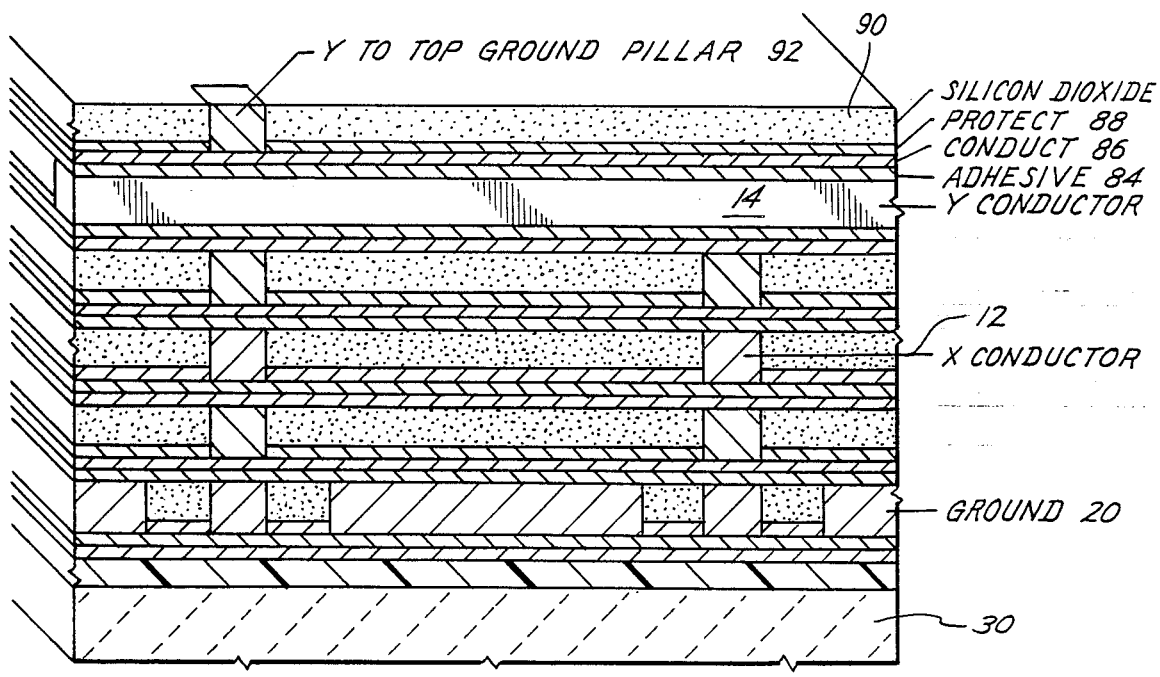

Referring now to FIG. 12, the process is repeated by providing another adhesion layer, consisting of adhesive 84, conduct layer 86, and protect layer 88, and a silicon dioxide layer 90 to provide a connection 92 between the Y conductor 14 and a top ground plane (not shown).

Figure 13:
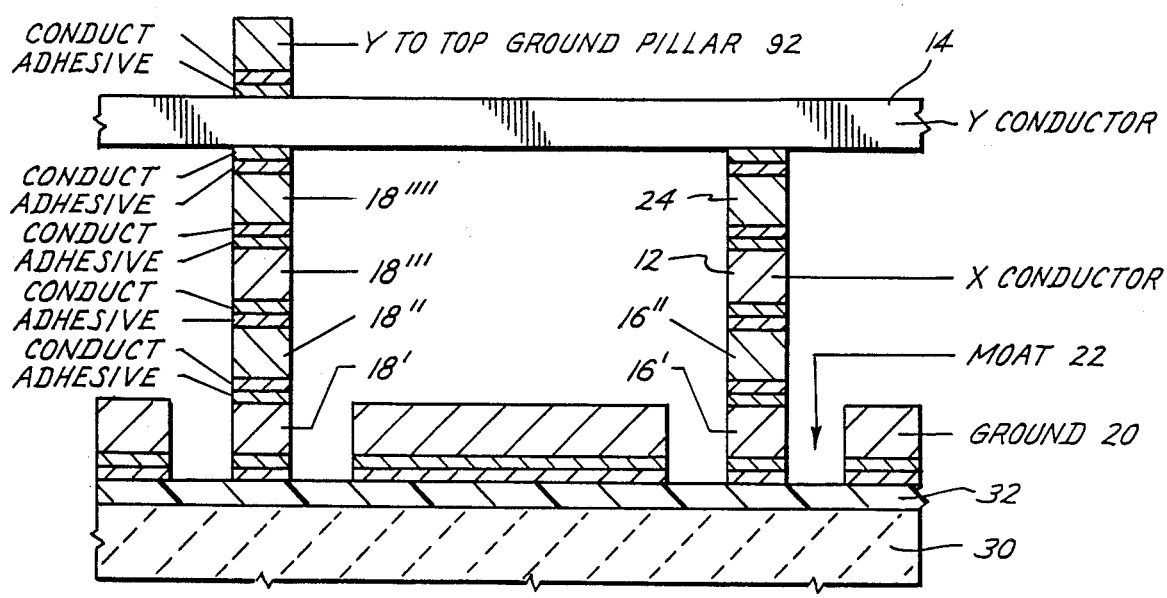

Referring now to FIG. 13, the temporary support consisting of the various layers of silicon dioxide 40, 50, 60, 72, 80, and 90 are shown removed for the purpose of using air as the dielectric or for the purpose of backfilling with a permanent low dielectric material. The temporary dielectrics of silicon dioxide are removed by using a solution of hydrofluoric acid, slightly buffered or concentrated, which selectively and rapidly dissolves the temporary support silicon dioxide dielectrics. The final unsupported interconnect system is shown in FIG. 13. In practice, the temporary support dielectrics 40, 50, 60, 72, 80, and 90 are removed layer by layer first using hydrofluoric acid to remove the silicon dioxide, then an adhesive layer/copper layer etch, such as ammonium persulfate with sulfuric acid for copper followed by potassium hydroxide with potassium ferricyanide for chrome, to remove the adhesion or plating interconnect. Removal of the sequential adhesion layers also thins the previously exposed copper pillars 16 and 18 and conductors 12 and 14 slightly during each succeeding etch step so preferably the upper conductor layers and pillar layers are designed increasingly and slightly oversized to accommodate this material loss.

Figure 14:
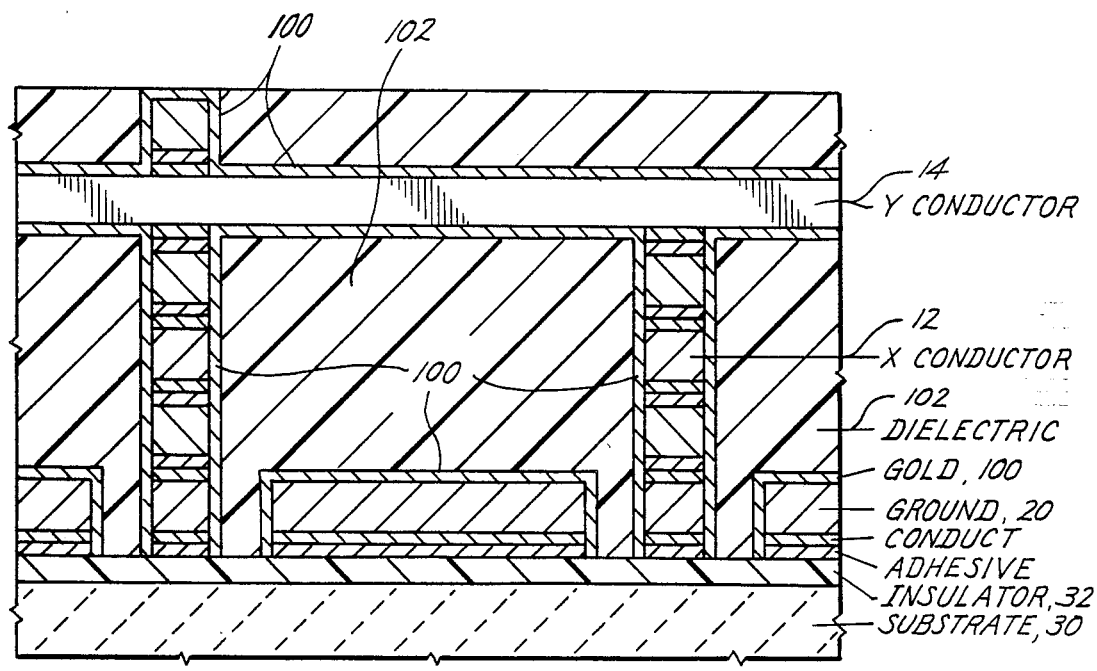

The portion of the interconnect shown in FIG. 13, with the temporary dielectric removed, is now fully supported in air by the integral metallic pillars 16, 18 and connection 24, and all of the metal surfaces are available for overcoating. Thus, as best seen in FIG. 14, an overcoat 100 is provided over all metal surfaces to enhance surface conductivity by reducing copper corrosion for a final airbridge interconnect or by plating nickel, gold or palladium, for example, when backfilling the interconnect with a dielectric 102 such as polyimide, for example, to prevent copper/polyimide interfacial corrosion. The interconnect with now fully exposed components is available for backfilling with any suitable low dielectric 102 which may have been impossible to incorporate into the sequential fabrication process as described, due to processing limitations. For example, a hardenable liquid dielectric such as polystyrene foam can now be used as a low dielectric constant backfill but would not be suitable for use during the fabrication sequence.

In other instances it may be advantageous to coat the exposed conductor surfaces with a metal having much higher conductivity than it is possible to build the conductors with in the first place. This will enhance the high frequency performance of the system. For example, the conductors 12 and 14 may be easily fabricated using a plated nickel process using silicon dioxide as the temporary dielectric support. Since nickel is a relatively poor conductor, the electrical performance of the system will be enhanced by plating the nickel conductors with gold 100 after the silicon dioxide is stripped.

Not shown in any of the drawings are large bond pad structures for chip die attach either by conventional tape automated bonding, or by flip chip solder bonding. These structures may be built up sequentially during the fabrication process, and like the support pillars 16 and 18, are moat 22 isolated from the bottom ground plane 20. Both X and Y conductors 12 and 14 terminate at these large bond pad sites as a function of the particular conductor routing for each unique interconnect system 10.

The method of fabricating the electric interconnect system of the present invention is apparent from the foregoing description and includes covering a substrate with a layer of an insulating material, applying an adhesion layer to the insulating material, and applying a conductive ground plane and a plurality of first layers of support pillars over the adhesion layer leaving openings in the ground plane around the first layers for isolating support pillars from the ground plane. The method includes applying a second adhesion layer to the first layers and the ground plane and applying a second layer of insulating material over the second adhesion layer and etching holes in the second layer of insulating material over the first layers of the support pillars. The method further includes plating a second metallic layer onto each of the first layers of the support pillars, applying a third adhesion layer and third insulating layer and etching the third insulating layer for a layer of support pillars and at least one metallic conductor. Thereafter, a third layer of support layers and at least one metallic conductor are plated into the openings and additional layers of support pillars and metallic conductors are formed above the third layers, and thereafter the layers of insulating material are removed.

The method further includes placing a low dielectric material into the space created by removing the insulating material and/or applying a protective coating to the pillars and the conductors, and/or coating the metallic conductors with a metal having a higher conductivity than the metallic conductors.

The present invention, therefore, is well adapted to carry out the objects and attain the ends and advantages mentioned as well as others inherent therein. While presently preferred embodiments of the invention have been given for the purpose of disclosure, numerous changes in the details of construction and the steps of the method, will be readily apparent to those skilled in the art and which are encompassed within the spirit of the invention and the scope of the appended claims.

What is claimed is:

1. A method of fabricating a high density electrical interconnect system comprising, covering a substrate with a layer of an insulating material, applying an adhesion layer to the insulating material, applying a conductive ground plane and a plurality of first layers of support pillars over the adhesion layer leaving openings in the ground plane around the first layers for isolating the support pillars from the ground plane, applying a second adhesion layer to the first layers and the ground plane, applying a second layer of insulating material over the second adhesion layer, etching holes in the second layer of insulating material over the first layers of the support pillars, plating a second layer onto each of the first layers of the support pillars, applying a third adhesion layer over the second layer of the support pillars, applying a third layer of insulating material over the third adhesion layer, etching the third layer of insulating material to form openings for a third layer of support pillars and at least one metallic conductor, plating into the openings in the third layer of insulating material a third layer of support layers onto some of the second layers of support layers, forming additional layers of support pillars and metallic conductors above the third layer of support layers and said metallic conductor, and removing the layers of insulating material.

2. The method of claim 1 including, placing a low dielectric material into the space created by removing the insulating material.

3. The method of claim 1 including, applying a protective coating to the pillars and the conductors.

4. The method of claim 3 including, placing a low dielectric material into the space created by removing the insulating material.

5. The method of claim 1 including, coating the metallic conductors with a metal having a higher conductivity than the metallic conductors after removing the layers of insulating material.

* * * * *